(12) United States Patent
Denda et al.

(10) Patent No.: US 9,826,639 B2
(45) Date of Patent: Nov. 21, 2017

(54) WIRING SUBSTRATE

(71) Applicant: SHINKO ELECTRIC INDUSTRIES CO., LTD., Nagano (JP)

(72) Inventors: Tatsuaki Denda, Nagano (JP); Osamu Hoshino, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 15/351,814

(22) Filed: Nov. 15, 2016

(65) Prior Publication Data

US 2017/0164473 A1    Jun. 8, 2017

(30) Foreign Application Priority Data

Dec. 8, 2015 (JP) ................................. 2015-239315

(51) Int. Cl.
*H05K 1/11* (2006.01)
*H05K 1/18* (2006.01)

(52) U.S. Cl.
CPC ............. *H05K 1/113* (2013.01); *H05K 1/181* (2013.01); *H05K 2201/10106* (2013.01); *H05K 2201/10545* (2013.01)

(58) Field of Classification Search
CPC . H05K 1/11; H05K 3/40; H05K 3/421; H05K 3/423; H05K 3/244; H01L 21/486; H01L 21/563; H01L 21/4853; H01L 21/4857

USPC ........ 174/262, 255, 257, 258, 260; 257/700, 257/738, 758; 427/123; 439/55

See application file for complete search history.

(56) References Cited

U.S. PATENT DOCUMENTS

| | | | | |
|---|---|---|---|---|
| 6,034,428 | A | * | 3/2000 | Kawahara .......... H01L 23/3121 257/700 |
| 7,589,416 | B2 | * | 9/2009 | Kuwajima ............ H05K 1/116 257/700 |
| 7,883,614 | B2 | | 2/2011 | Gotoh et al. |
| 2009/0220683 | A1 | * | 9/2009 | Gotoh ................... H05K 3/421 427/123 |
| 2010/0065318 | A1 | * | 3/2010 | Nagasawa ........ H01L 23/49827 174/260 |
| 2011/0094780 | A1 | * | 4/2011 | Uchibori ............. H05K 1/0265 174/258 |

FOREIGN PATENT DOCUMENTS

JP         2005-019918         1/2005

* cited by examiner

*Primary Examiner* — Xiaoliang Chen
(74) *Attorney, Agent, or Firm* — IPUSA, PLLC (57) ABSTRACT

A wiring substrate includes an insulating layer, a first wiring layer and a second wiring layer on opposite sides of the insulating layer, and a via piercing through the first wiring layer and the insulating layer to electrically connect to the second wiring layer. The via includes an end portion projecting from a first surface of the first wiring layer facing away from the insulating layer. A surface of the end portion facing in the same direction as the first surface of the first wiring layer is depressed to be deeper in the center than in the periphery.

8 Claims, 10 Drawing Sheets

WIRING SUBSTRATE

CROSS-REFERENCE TO RELATED APPLICATION

This application is based upon and claims the benefit of priority of the prior Japanese Patent Application No. 2015-239315, filed on Dec. 8, 2015, the entire contents of which are incorporated herein by reference.

FIELD

A certain aspect of the embodiments discussed herein is related to wiring substrates and methods of manufacturing a wiring substrate.

BACKGROUND

Conventional wiring substrates that include a first wiring layer and a second wiring layer that are foamed at the top and bottom, respectively, of an insulating layer to be electrically connected by a via are known. To manufacture such wiring substrates, for example, a dry film is patterned on one side of a base of which both sides are provided with copper foil. The copper foil on the one side is etched, and the dry film is thereafter removed. Thereafter, a through hole is formed in the insulating layer using a laser, and electroplating is performed to foam a via that fills in the through hole and form an electroplating film on the entire surface of the copper foil on the one side. Thereafter, the copper foil on both sides is patterned to complete a wiring substrate (see, for example, Japanese Patent No. 3626486).

SUMMARY

According to an aspect of the present invention, a wiring substrate includes an insulating layer, a first wiring layer and a second wiring layer on opposite sides of the insulating layer, and a via piercing through the first wiring layer and the insulating layer to electrically connect to the second wiring layer. The via includes an end portion projecting from a first surface of the first wiring layer facing away from the insulating layer. A surface of the end portion facing in the same direction as the first surface of the first wiring layer is depressed to be deeper in the center than in the periphery.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

As described above, there are conventional wiring substrates that include wiring layers that are provided one on each side of an insulating layer to be electrically connected by a via. According to such wiring substrates, however, the via is less likely to effectively serve as a heat transfer (dissipation) path because the through hole formed using a laser is relatively small in diameter. For example, when considering the case of mounting an electronic component that generates (releases) heat on a wiring substrate, it is preferable to effectively use the via as a heat transfer path to improve heat dissipation.

According to an aspect of the present invention, the heat dissipation of a wiring substrate that includes a via is improved.

Preferred embodiments of the present invention will be explained with reference to accompanying drawings. In the following description, the same element is referred to using the same reference numeral, and a repetitive description thereof may be omitted.

[a] First Embodiment

Figure 1:
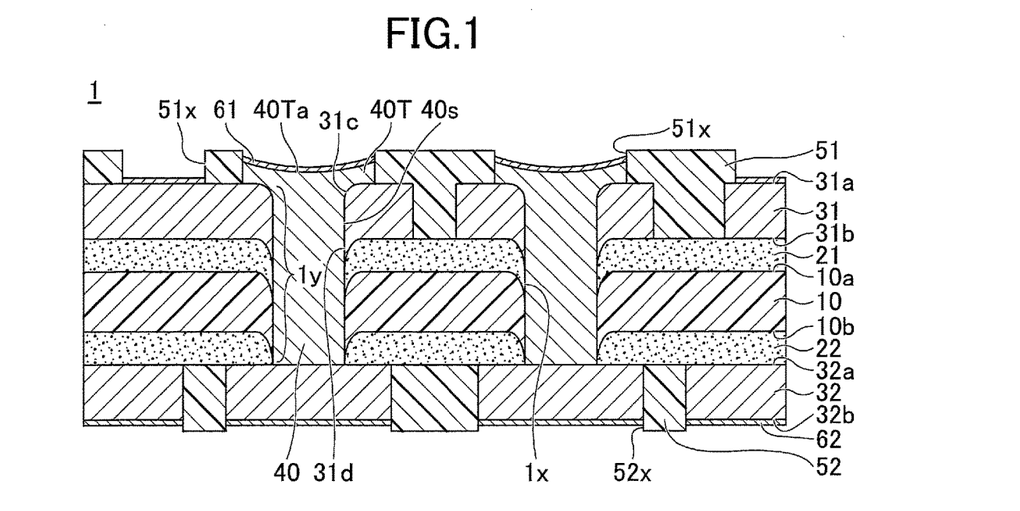
FIG. 1 is a cross-sectional view of a wiring substrate according to a first embodiment.

First, a structure of a wiring substrate according to a first embodiment is described. FIG. 1 is a cross-sectional view of a wiring substrate according to the first embodiment. Referring to FIG. 1, a wiring substrate 1 includes an insulating layer 10, adhesive layers 21 and 22, wiring layers 31 and 32, vias 40, solder resist layers 51 and 52, and metal layers 61 and 62. Hereinafter, the vias 40 may be collectively referred to as "via 40" where the description is common to the vias 40.

According to this embodiment, for the sake of convenience, the solder resist layer 51 side of the wiring substrate 1 is referred to as "upper side" or "first side" and the solder resist layer 52 side of the wiring substrate 1 is referred to as "lower side" or "second side." Furthermore, with respect to a part or element of the wiring substrate 1, a surface or end on the solder resist layer 51 side is referred to as "upper surface or end" or "first surface or end" and a surface or end on the solder resist layer 52 side is referred to as "lower surface or end" or "second surface or end." The wiring substrate 1, however, may be used in an upside-down position or oriented at any angle. Furthermore, a plan view refers to a view of an object taken in a direction normal to the first surface of the insulating layer 10, and a planar shape refers to the shape of an object viewed in a direction normal to the first surface of the insulating layer 10.

According to the wiring substrate 1, for example, a flexible insulating resin film may be employed as the insulating layer 10. Suitable examples of insulating resin films include a polyimide resin film and a polyester resin film. The insulating layer 10, however, is not limited to a flexible insulating resin film, and may be, for example, an FR4 (Flame Retardant Type 4) glass epoxy resin substrate. The thickness of the insulating layer 10 may be, for example, approximately 10 μm to approximately 50 μm.

The adhesive layer 21 is applied on a first surface 10a of the insulating layer 10 to bond the wiring layer 31 to the insulating layer 10. The adhesive layer 22 is applied on a second surface 10b of the insulating layer 10 opposite to the first surface 10a to bond the wiring layer 32 to the insulating layer 10. Suitable examples of the adhesive layers 21 and 22 include an epoxy adhesive. The thickness of each of the adhesive layers 21 and 22 may be, for example, approximately 3 μm to approximately 10 μm.

The wiring layers 31 and 32 are provided on the first side and the second side, respectively, of the insulating layer 10. Specifically, the wiring layer 31 (a first wiring layer) is provided on the first surface 10a of the insulating layer 10 with the adhesive layer 21 interposed between the wiring layer 31 and the insulating layer 10. The wiring layer 31 is patterned to have a predetermined planar shape. The wiring layer 32 (a second wiring layer) is provided on the second surface 10b of the insulating layer 10 with the adhesive layer 22 interposed between the wiring layer 32 and the insulating layer 10. The wiring layer 32 is patterned to have a predetermined planar shape. Suitable materials for the wiring layers 31 and 32 include, for example, copper (Cu). The thickness of each of the wiring layers 31 and 32 may be, for example, approximately 12 μm to approximately 50 μm.

Through holes 1x pierce through the wiring layer 31, the adhesive layer 21, the insulating layer 10, and the adhesive layer 22 to expose a first surface 32a of the wiring layer 32. The through holes 1x may be hereinafter collectively referred to as "through hole 1x" where the description is common to the through holes 1x. The planar shape of the through hole 1x may be, for example, a circle of approximately 150 μm in diameter. In view of heat dissipation, the circle may have a greater diameter (for example, approximately a few millimeters). The through hole 1x is foamed by performing punching (piercing) from the wiring layer 31 through to the adhesive layer 22 using, for example, a punch and die. Therefore, a via-contacting part 1y of each of the wiring layer 31, the adhesive layer 21, the insulating layer 10, and the adhesive layer 22 that contacts a sidewall 40s of the via 40 is deformed to droop.

That is, a corner or edge 31c of the via-contacting part 1y of the wiring layer 31 at a first surface 31a of the wiring layer 31 is rounded to form a curved surface (forming a so-called "shear droop" in the punching direction). Furthermore, a corner or edge 31d of the via-contacting part 1y of the wiring layer 31 at a second surface 31b of the wiring layer 31 opposite to the first surface 31a projects toward the insulating layer 10 relative to the second surface 31b of the wiring layer 31 (forming a so-called "burr" in the punching direction). The adhesive layer 21, the insulating layer 10, and the adhesive layer 22 have the same shape as the wiring layer 31 except that the adhesive layer 22 does not have a burr at its lower surface.

The via 40 fills in the through hole 1x. The upper end portion of the via 40 projects from the first surface 31a of the wiring layer 31, and circularly spreads (extends) onto part of the first surface 31a around the upper end (opening) of the through hole 1x to form a projection 40T. The lower end of the via 40 is directly joined to the first surface 32a of the wiring layer 32. The wiring layer 31 and the wiring layer 32 are electrically connected by the via 40. Suitable materials for the via 40 (including the projection 40T) include, for example, copper.

The planar shape of the projection 40T may be, for example, a circle of approximately 200 μm in diameter. That is, the planar shape of the projection 40T is greater in diameter than the planar shape of part of the via 40 inside (that is, filling in) the through hole 1x (namely, the planar shape of the through hole 1x). An upper surface 40Ta of the projection 40T is depressed to be deeper in the center than in the periphery. For example, the upper surface 40Ta of the projection 40T may be a concave surface that curves inward to gradually become deeper in the direction from the periphery to the center.

The projection 40T may serve as a pad to connect to an electronic component. In the case of using the projection 40T as a pad, the thickness of the projection 40T may be, for example, approximately 10 μm to approximately 20 μm. The projection 40T may also serve as a pillar to connect to an electronic component. In the case of using the projection 40T as a pillar, the thickness of the projection 40T may be, for example, approximately 100 μm to approximately 200 μm.

The solder resist layer 51 is formed on the adhesive layer 21 to cover the first surface 31a of the wiring layer 31. The solder resist layer 51 includes openings 51x. Part of the first surface 31a of the wiring layer 31 or the upper surface 40Ta of the projection 40T is exposed in each opening 51x. The wiring layer 31 and the projection 40T exposed in the openings 51x define pads for external connection (external connection pads) to connect to an electronic component such as a semiconductor chip. The exposed part of the first surface 31a of the wiring layer 31 and the upper surface 40Ta of the projection 40T, however, do not have to be both used as pads, and part of the first surface 31a of the wiring layer 31 or the upper surface 40Ta of the projection 40T alone may be exposed inside the corresponding opening 51x to serve as a pad, depending on the intended use. The openings 51x may be hereinafter collectively referred to as "opening 51x" where the description is common to the openings 51x.

The opening 51x may be formed to overlap part of the wiring layer 31 that forms a pad or the projection 40T (to form a solder mask defined (SMD) pad). Alternatively, the opening 51x may be formed with a gap between a surface of the solder resist layer 51 exposed in the opening 51x and a side surface of part of the wiring layer 31 that fauns a pad or a side surface of the projection 40T (to form a non solder mask defined (NSMD) pad).

The solder resist layer 52 is formed on the adhesive layer 22 to cover the second surface 32b of the wiring layer 32. The solder resist layer 52 includes openings 52x in which part of the second surface 32b of the wiring layer 32 is exposed. The openings 52x may be hereinafter collectively referred to as "opening 52x" where the description is common to the openings 52x. The wiring layer 32 exposed inside the opening 52x defines an external connection pad to connect to an electronic component such as a semiconductor chip. The opening 52x may be formed to overlap part of the wiring layer 32 that forms a pad (to form an SMD pad). Alternatively, the opening 52x may be formed with a gap between a surface of the solder resist layer 52 exposed in the opening 52x and a side surface of part of the wiring layer 32 that foams a pad (to form an NSMD pad). Suitable materials for the solder resist layers 51 and 52 include, for example, a photosensitive epoxy insulating resin and a photosensitive acrylic insulating resin. The thickness of each of the solder resist layers 51 and 52 may be, for example, approximately 5 μm to approximately 40 μm.

The metal layer 61 is formed on part of the first surface 31a of the wiring layer 31 and the upper surface 40Ta of the projection 40T that are exposed in the openings 51x of the solder resist layer 51. The metal layer 62 is formed on part of the second surface 32b of the wiring layer 32 exposed in the openings 52x of the solder resist layer 52. Suitable examples of the metal layers 61 and 62 include a gold (Au) layer, a Ni/Au layer (a laminated metal layer of a nickel [Ni] layer and a Au layer that are stacked in this order), and a Ni/Pd/Au layer (a laminated metal layer of a Ni layer, a palladium [Pd] layer, and a Au layer that are stacked in this order). The metal layers 61 and 62 are optional and may be formed on an as-needed basis. Instead of forming the metal layer 61 or 62, an anti-oxidation treatment such as an organic solderability preservative (OSP) process may be performed. A surface treatment layer formed by the OSP process is an organic coating formed of, for example, an azole compound or an imidazole compound.

Figure 2:
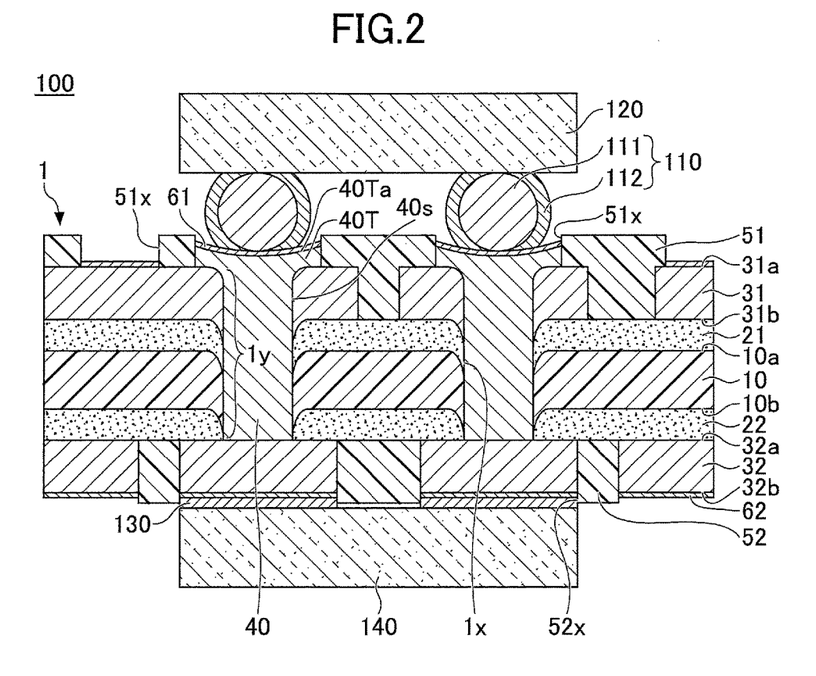
FIG. 2 is a cross-sectional view of a semiconductor device according to the first embodiment.

FIG. 2 is a cross-sectional view of a semiconductor device according to the first embodiment. Referring to FIG. 2, a semiconductor device 100 includes the wiring substrate 1, an electronic component 120 mounted on the upper surface of the wiring substrate 1 through bumps 110, and an electronic component 140 mounted on the lower surface of the wiring substrate 1 through a joining layer 130. One or both of the electronic components 120 and 140 are semiconductor chips such as a light-emitting device. According to the semiconductor device 100, resistors, capacitors, inductors, etc., may be mounted on the wiring substrate 1 in addition to semiconductor chips.

The bumps 110 electrically connect the metal layer 61 of the wiring substrate 1 and electrodes (not depicted) of the electronic component 120. For example, solder balls each having a copper core ball 111 enclosed by solder 112 may be used as the bumps 110. The joining layer 130 electrically connects the metal layer 62 of the wiring substrate 1 and electrodes (not depicted) of the electronic component 140. Suitable materials for the joining layer 130 include, for example, solder.

As described above, according to the wiring substrate 1, the upper surface 40Ta of the projection 40T of the via 40 is depressed to be deeper in the center than in the periphery. Accordingly, solder balls serving as the bumps 110 can be easily positioned. Furthermore, the planar shape of the projection 40T is greater in diameter than the planar shape of part of the via 40 inside the through hole 1*x* (namely, the planar shape of the through hole 1*x*), and the upper surface 40Ta of the projection 40T is depressed to be deeper in the center than in the periphery. This shape of the projection 40T makes it possible to increase the surface area of the projection 40T to increase the heat dissipation of the semiconductor device 100.

In the case where a through hole that is relatively small (approximately tens of micrometers) in diameter is conventionally formed using a laser, the upper surface of the projection is substantially flat. In contrast, according to this embodiment, the through hole 1*x* is a hole formed by piercing to have a relatively large diameter (approximately 150 μm). Therefore, the upper surface 40Ta of the projection 40T of the via 40 filling in the through hole 1*x* is depressed to increase the surface area of the projection 40T.

In particular, the via 40 is directly joined to the wiring layer 32 (pad) connected to the electronic component 140. Therefore, when the electronic component 140 is a heat-generating component, heat generated by the electronic component 140 is efficiently transferred to the via 40 through the wiring layer 32 (pad) to be released from the upper surface 40Ta of the projection 40T through the via 40 serving as a heat transfer path. In this case as well, because the through hole 1*x* is a hole formed by piercing to have a relatively large diameter (approximately 150 μm), the thermal resistance of the via 40 serving as a heat transfer path can be reduced to create an advantage in heat dissipation.

Next, a method of manufacturing a wiring substrate according to the first embodiment is described. FIGS. 3A through 3K are diagrams depicting a process of manufacturing a wiring substrate according to the first embodiment. Each of the cross-sectional views used in the description of the process of manufacturing a wiring substrate according to the first embodiment corresponds to FIG. 1.

Figure 3A:
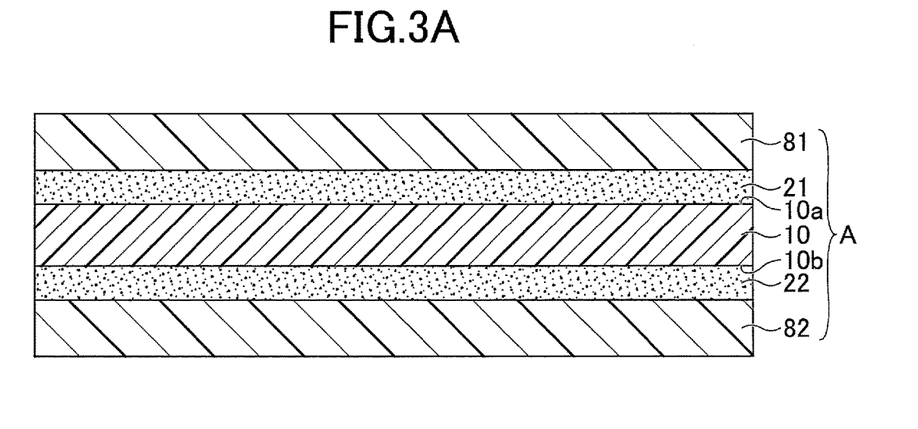
FIGS. 3A through 3K are diagrams depicting a process of manufacturing a wiring substrate according to the first embodiment.

First, in the process depicted in FIG. 3A, a base A in which a protection film 81 is removably provided on the first surface 10*a* of the insulating layer 10 through the adhesive layer 21 and a protection film 82 is removably provided on the second surface 10*b* of the insulating layer 10 through the adhesive layer 22 is prepared. The material and the thickness of the insulating layer 10 and the material and the thickness of the adhesive layers 21 and 22 are as described above. Suitable materials for the protection films 81 and 82 include, for example, a polyethylene terephthalate (PET) film. The thickness of each of the protection films 81 and 82 may be, for example, approximately 25 μm to approximately 50 μm.

Figure 3B:
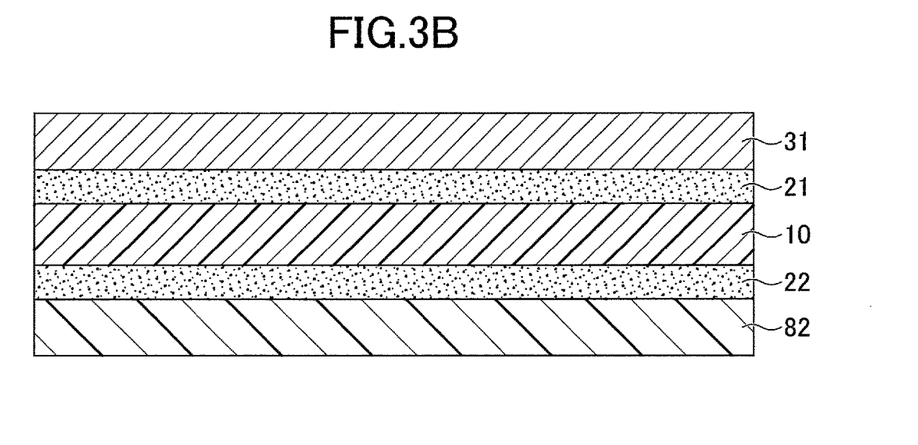

Next, in the process depicted in FIG. 3B, the protection film 81 is removed from the base A, and the wiring layer 31 is formed on the upper surface of the adhesive layer 21. The wiring layer 31 may be foamed by laminating the upper surface of the adhesive layer 21 with a metal layer such as copper foil. The material and the thickness of the wiring layer 31 are as described above.

Figure 3C:
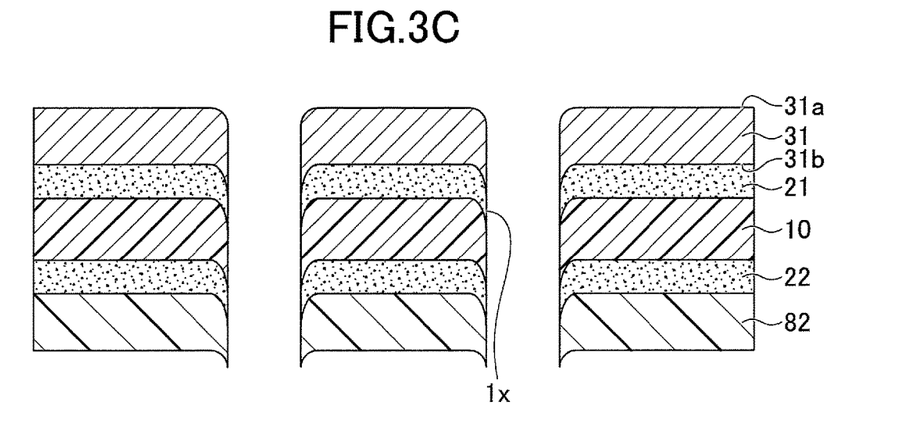

Next, in the process depicted in FIG. 3C, piercing (punching) is performed from the first surface 31*a* of the wiring layer 31 through to the protection film 82 to form the through hole 1*x* that penetrates the wiring layer 31, the adhesive layer 21, the insulating layer 10, the adhesive layer 22, and the protection film 82. The planar shape and the size of the through hole 1*x* are as described above. As a result of the piercing, a hole-defining part of the wiring layer 31, the adhesive layer 21, the insulating layer 10, the adhesive layer 22, and the protection film 82 that defines the through hole 1*x* (to ultimately contact the sidewall 40*s* of the via 40) deforms to droop.

That is, the corner or edge of the hole-defining part of the wiring layer 31 at the first surface 31*a* of the wiring layer 31 is rounded to form a curved surface (forming a so-called "shear droop" in the punching direction). Furthermore, the corner or edge of the hole-defining part of the wiring layer 31 at the second surface 31*b* of the wiring layer 31 projects toward the insulating layer 10 relative to the second surface 31*b* of the wiring layer 31 (forming a so-called "burr" in the punching direction). The adhesive layer 21, the insulating layer 10, the adhesive layer 22, and the protection film 82 have the same shape as the wiring layer 31.

Figure 3D:
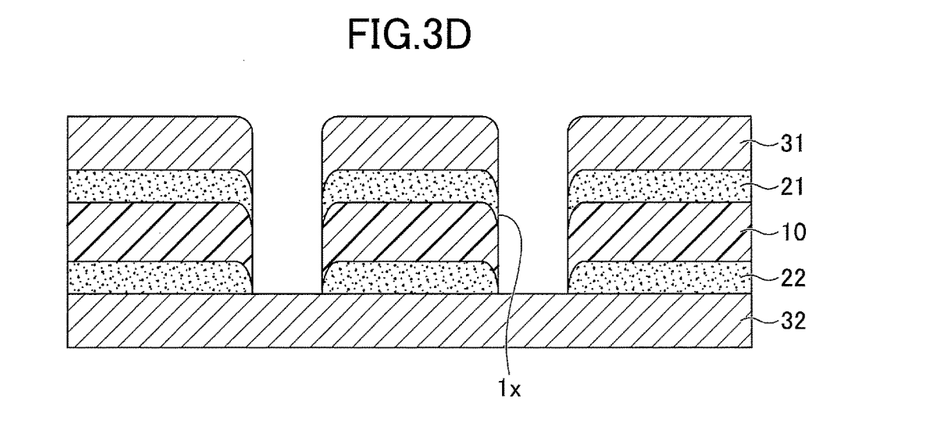

Next, in the process depicted in FIG. 3D, the protection film 82 is removed from the structure depicted in FIG. 3C, and the wiring layer 32 is formed on the lower surface of the adhesive layer 22. The wiring layer 32 may be formed by laminating the lower surface of the adhesive layer 22 with a metal layer such as copper foil. The material and the thickness of the wiring layer 32 are as described above.

Figure 3E:
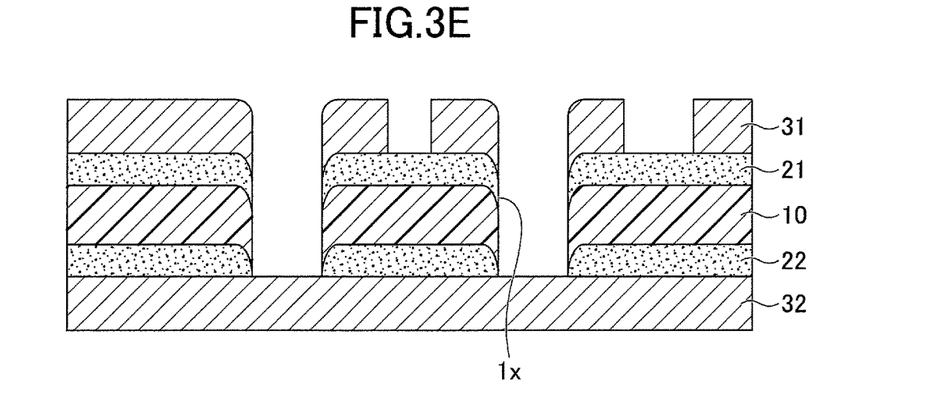

Next, in the process depicted in FIG. 3E, the wiring layer 31 is patterned by, for example, a subtractive process. That is, the wiring layer 31 may be patterned by forming a resist on part of the wiring layer 31 to be left and removing part of the wiring layer 31 that is not covered with the resist by etching.

Figure 3F:
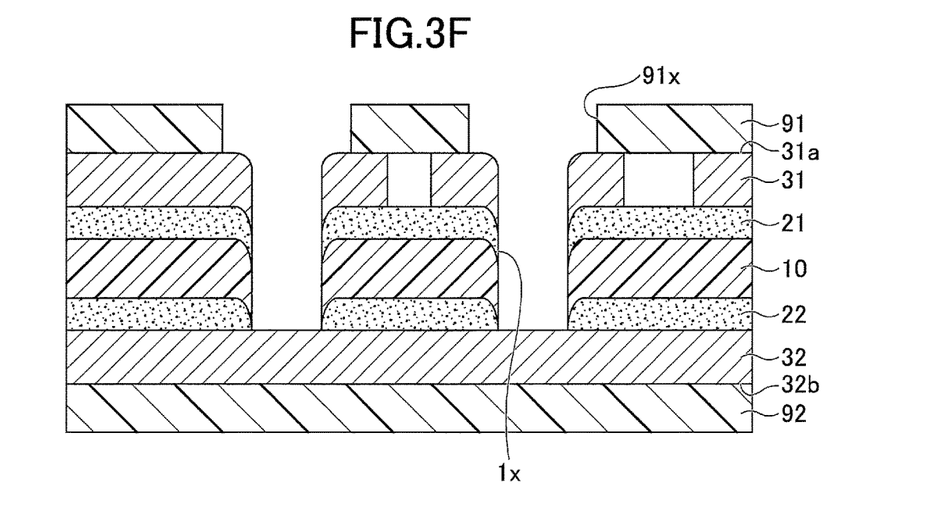

Next, in the process depicted in FIG. 3F, a masking layer 91 is formed on the first surface 31*a* of the wiring layer 31, and a masking layer 92 is formed on the second surface 32*b* of the wiring layer 32. The masking layers 91 and 92 may be famed by, for example, laminating the first surface 31*a* and the second surface 32*b* with a photosensitive resin film. Thereafter, for example, the masking layer 91 is exposed to light and developed to form openings 91*x* each exposing the through hole 1*x* and part of the first surface 31*a* of the wiring layer 31 around the upper end of the through hole 1x in the masking layer 91. That is, each opening 91x is formed where the projection 40T of the via 40 is formed in the subsequent process.

Figure 3G:
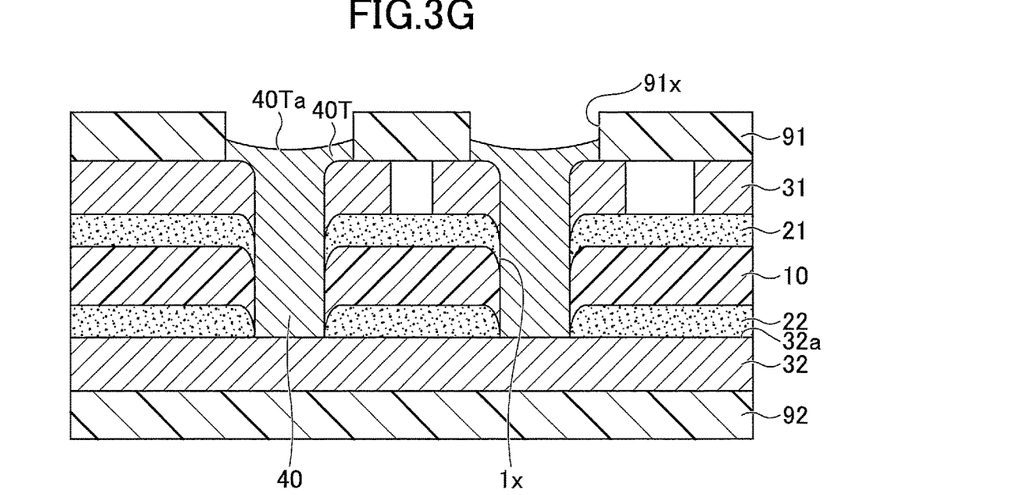

Next, in the process depicted in FIG. 3G, the surface of the hole-defining part of the structure depicted in FIG. 3F and part of the first surface 32a of the wiring layer 32 exposed in the through hole 1x are subjected to soft etching for approximately 1 μm to approximately 2 μm for cleaning (for example, removal of foreign substances). Thereafter, the via 40 is foamed by, for example, electroplating, using the wiring layer 32 as a power feed layer. Suitable materials for the via 40 include, for example, copper.

In this case, a copper plating film deposits and grows on the wiring layer 32 to fill in the through hole 1x exposed inside the opening 91x. As a result, the via 40 is famed to have its upper end portion projecting from the first surface 31a of the wiring layer 31 into the opening 91x. The portion of the via 40 projecting from the first surface 31a of the wiring layer 31 into the opening 91x defines the projection 40T. The upper surface 40Ta of the projection 40T is depressed to be deeper in the center than in the periphery. The projection 40T lies over part of the first surface 31a of the wiring layer 31 around the upper end (opening) of the through hole 1x exposed inside the opening 91x. The planar shape and the thickness of the projection 40T are as described above. In the case of using the projection 40T as a pillar, the masking layer 91 may be foamed to be correspondingly thicker and electroplating may be performed correspondingly longer.

As described above, the corner or edge of the hole-defining part of the wiring layer 31 at the second surface 31b of the wiring layer 31 projects toward the insulating layer 10 relative to the second surface 31b of the wiring layer 31. Therefore, the plating film depositing and growing on the wiring layer 32 joins to the wiring layer 31 at an early stage (at a lower position). That is, while the via 40 only contacts and does not join to the hole-defining part of the adhesive layer 21, the insulating layer 10, and the adhesive layer 22, it is possible to reduce part of the via 40 that does not join to the hole-defining part and increase part of the via 40 that joins to the hole-defining part of the wiring layer 31. As a result, it is possible to increase the reliability of the connection of the wiring layer 31 and the via 40.

Figure 3H:
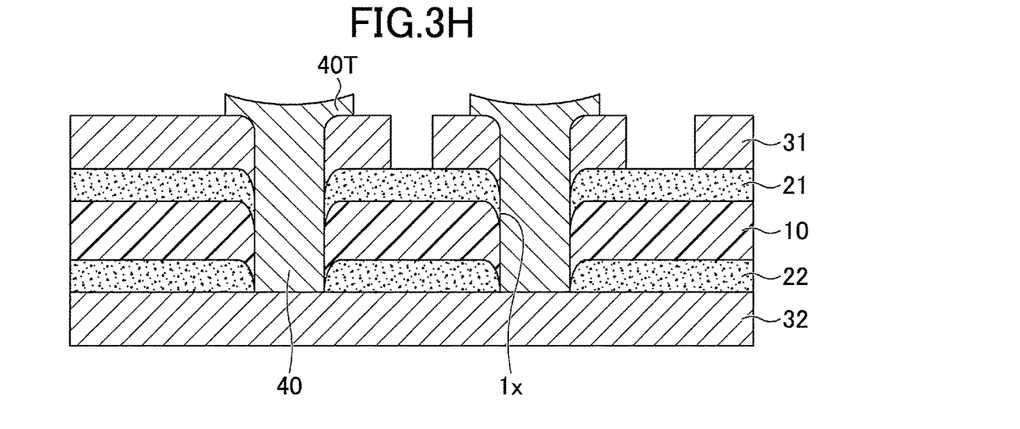

Next, in the process depicted in FIG. 3H, the masking layers 91 and 92 depicted in FIG. 3G are removed.

Figure 3I:
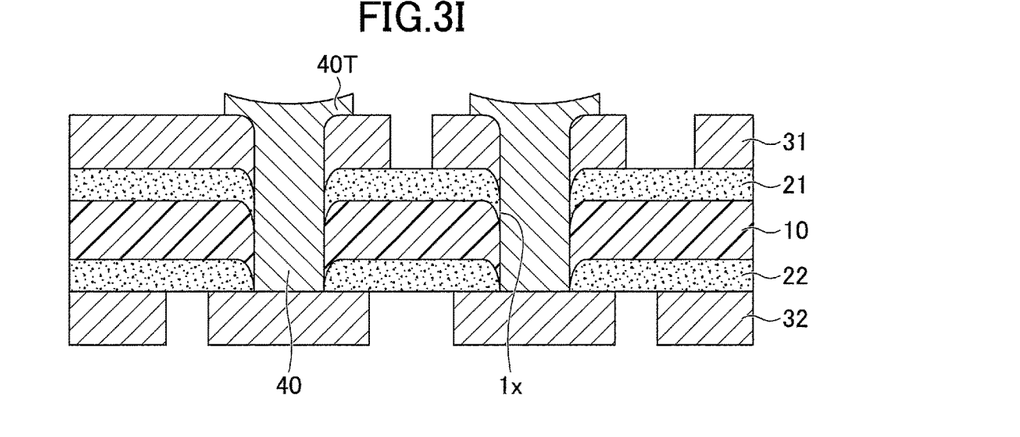

Then, in the process depicted in FIG. 3I, the wiring layer 32 is patterned by, for example, a subtractive process. That is, the wiring layer 32 may be patterned by forming a resist on part of the wiring layer 32 to be left and removing part of the wiring layer 32 that is not covered with the resist by etching.

The wiring layers 31 and 32 may be simultaneously patterned in the process depicted in FIG. 3I without executing the process depicted in FIG. 3E. In this case, the manufacturing process can be streamlined. In the case of using the projection 40T as a pillar, however, a resist to serve as an etching mask is difficult to be formed to cover the projection 40T because the projection 40T is thick. Therefore, in this case, it is preferable to pattern the wiring layer 31 in the process depicted in FIG. 3E before the formation of the projection 40T and to pattern the wiring layer 32 alone in the process depicted in FIG. 3I.

Figure 3J:
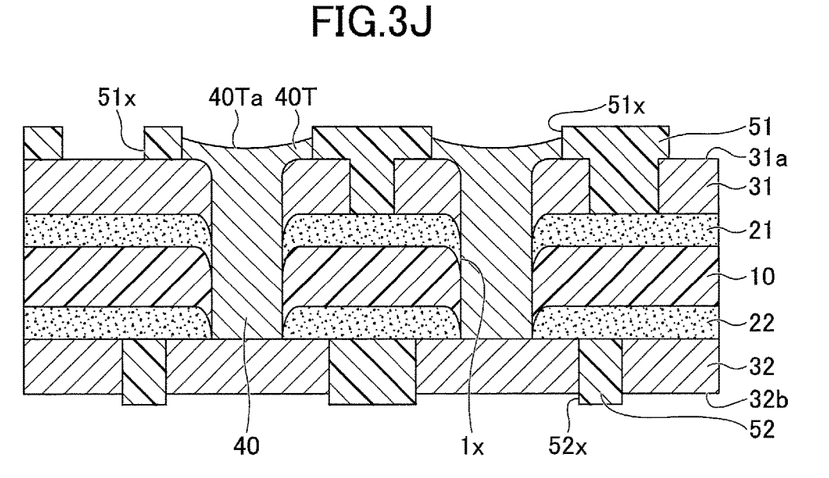

Next, in the process depicted in FIG. 3J, the solder resist layer 51 is formed on the upper surface of the adhesive layer 21 to cover the wiring layer 31 and the via 40. Then, the openings 51x are famed in the solder resist layer 51 to expose part of the first surface 31a of the wiring layer 31 and the upper surface 40Ta of the projection 40T of the via 40. Furthermore, the solder resist layer 52 is formed on the lower surface of the adhesive layer 22 to cover the wiring layer 32. Then, the openings 52x are formed in the solder resist layer 52 to expose part of the second surface 32b of the wiring layer 32.

The solder resist layer 51 may be foamed by, for example, applying a photosensitive resin in liquid or paste form onto the upper surface of the adhesive layer 21 by a process such as screen printing, roll coating, or spin coating to cover the wiring layer 31 and the via 40 with the photosensitive resin. Alternatively, the upper surface of the adhesive layer 21 may be laminated with a photosensitive resin in film form to cover the wiring layer 31 and the via 40 with the photosensitive resin. The solder resist layer 52 may be formed in the same manner. The material and the thickness of the solder resist layers 51 and 52 are as described above. The openings 51x and 52x may be formed by, for example, photolithography. Alternatively, a non-photosensitive insulating resin may be used for the solder resist layers 51 and 52 to form the openings 51x and 52x by a process such as laser processing or blasting.

Figure 3K:
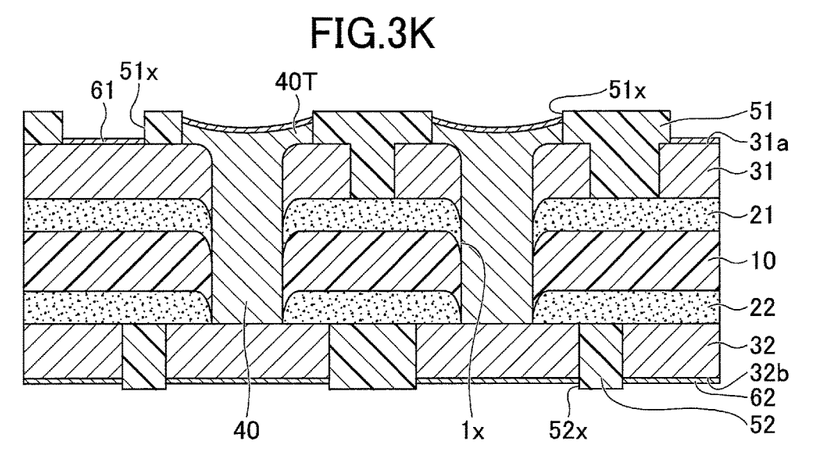

Next, in the process depicted in FIG. 3K, the metal layer 61 is formed on the part of the first surface 31a of the wiring layer 31 and the upper surface 40Ta of the projection 40T of the via 40 exposed inside the openings 51x of the solder resist layer 51. Furthermore, the metal layer 62 is formed on the part of the second surface 32b of the wiring layer 32 exposed inside the openings 52x of the solder resist layer 52. The metal layers 61 and 62 may be formed by, for example, electroless plating. Examples of suitable materials for the metal layers 61 and 62 are as described above. The metal layers 61 and 62 are optional and may be formed on an as-needed basis. Instead of forming the metal layer 61 or 62, an anti-oxidation treatment such as an OSP process may be performed.

Thus, according to the manufacturing process of the wiring substrate 1, while the via 40 is formed by electroplating (FIG. 3G), the masking layer 91 including the openings 91x that expose only a part to be subjected to electroplating is formed on the first surface 31a of the wiring layer 31 before performing electroplating (FIG. 3F). Accordingly, it is possible to reduce the area of the part to be subjected to electroplating, and therefore, it is possible to reduce time and an electric current for electroplating when performing electroplating to tom the via 40.

For example, according to the above-described background-art manufacturing method of a wiring substrate, electroplating is performed without using a masking layer to fill in a through hole to form a via, and to form an electroplating film on the entire surface of copper foil on one side of the base. In this case, when multiple vias start to be connected by the electroplating film formed on the copper foil, the current density per unit area sharply decreases to significantly delay the growth of the electroplating film. As a result, some vias are prevented from being connected to significantly reduce the connection reliability of the vias. To prevent this, it is required to significantly increase time for electroplating or cause a high electric current to flow through during electroplating.

In contrast, according to the manufacturing process of the wiring substrate 1, electroplating is performed after formation of the masking layer 91. Therefore, there occurs no connection of multiple vias (there is no significant drop in current density). Accordingly, it is possible to ensure the connection reliability of vias without significantly increasing time for electroplating or causing a high electric current to flow through during electroplating.

Furthermore, employment of not a permanent resist but a removable resist as the masking layer 91 in the process depicted in FIG. 3F makes it possible to form the opening 51x at any position by a process such as photolithography when forming the solder resist layer 51 in the process depicted in FIG. 3J. As a result, it is possible to provide the opening 51x near the via 40 to use part of the wiring layer 31 exposed inside the opening 51x as a pad to connect to another electronic component. Consequently, it is possible to reduce the size of the wiring substrate 1 and to mount multiple electronic components on the wiring substrate 1.

A variation of the first embodiment is described below. In the following description, the same element or configuration as that described in the first embodiment may be referred to using the same reference numeral, and a description thereof may be omitted. According to the variation, the upper surface 40Ta of the projection 40T is prevented from being exposed.

Figure 4:
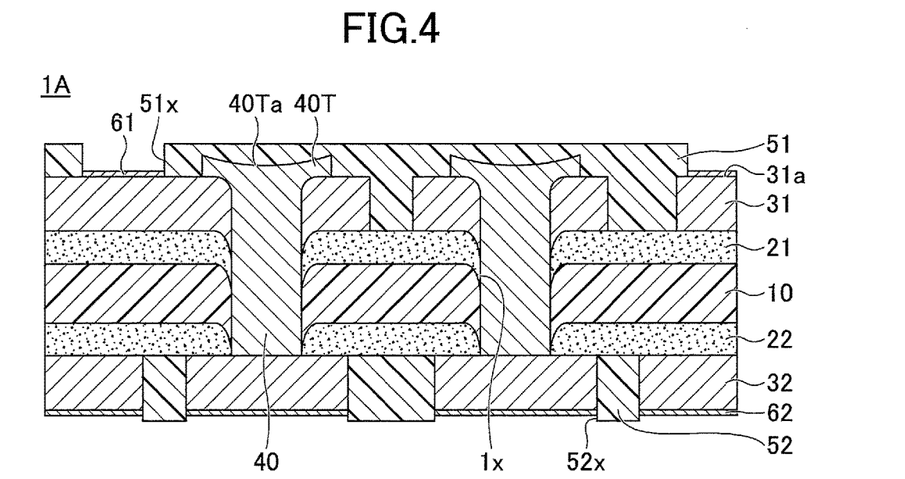
FIG. 4 is a cross-sectional view of a wiring substrate according to a variation of the first embodiment.

FIG. 4 is a cross-sectional view of a wiring substrate according to the variation of the first embodiment. Referring to FIG. 4, a wiring substrate 1A according to the variation is different from the wiring substrate 1 (FIG. 1) in that the metal layer 61 is not formed on the upper surface 40Ta of the projection 40T and that the upper surface 40Ta of the projection 40T is covered with the solder resist layer 51.

That is, according to the wiring substrate 1A, the solder resist layer 51 is provided to cover the first surface 31a of the wiring layer 31, and includes the opening 51x that exposes part of the first surface 31a of the wiring layer 31. Furthermore, the upper surface 40Ta of the projection 40T is covered with the solder resist layer 51. The wiring layer 31 exposed inside the opening 51x serves as an external connection pad to connect to an electronic component such as a semiconductor chip.

According to the wiring substrate 1A, the metal layers 61 and 62 are optional and may be formed on an as-needed basis. Furthermore, instead of forming the metal layer 61 or 62, an anti-oxidation treatment such as an OSP process may be performed. It is unnecessary, however, to form the metal layer 61 or perform an anti-oxidation treatment on the upper surface 40Ta of the projection 40T covered with the solder resist layer 51.

Figure 5:
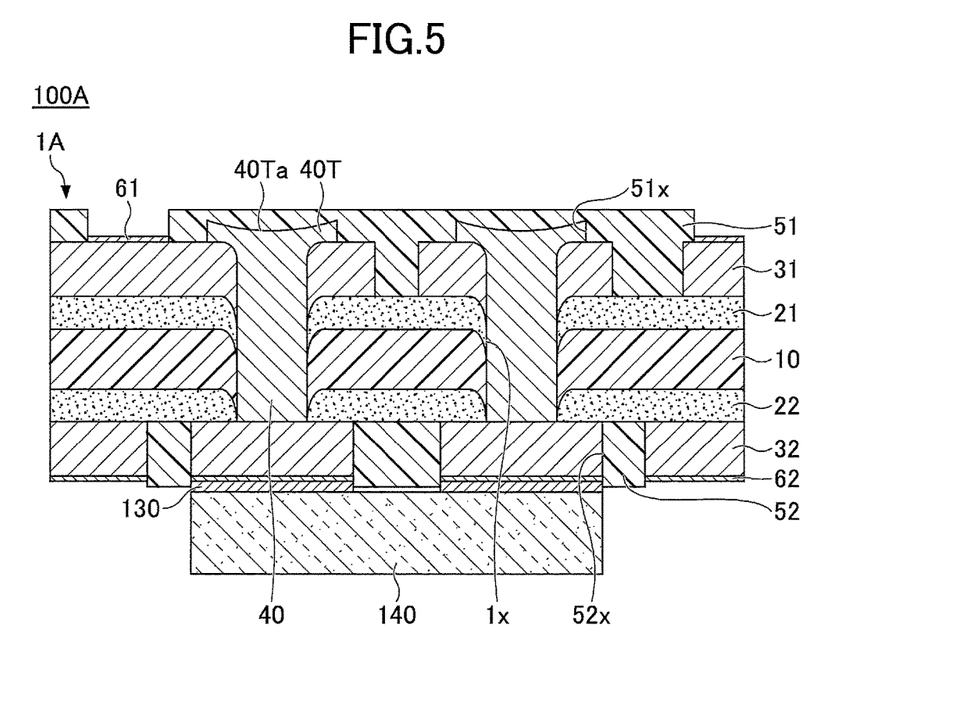
FIG. 5 is a cross-sectional view of a semiconductor device according to the variation of the first embodiment.

FIG. 5 is a cross-sectional view of a semiconductor device according to the variation of the first embodiment. Referring to FIG. 5, a semiconductor device 100A includes the wiring substrate 1A and the electronic component 140 mounted on the lower surface of the wiring substrate 1A through the joining layer 130. The electronic component 140 is, for example, a semiconductor chip such as a light-emitting device. According to the semiconductor device 100A, resistors, capacitors, inductors, etc., may be mounted on the wiring substrate 1A in addition to a semiconductor chip. For example, various components may be mounted on the metal layer 61 exposed inside the opening 51x.

Thus, the upper surface 40Ta of the projection 40T may be covered with the solder resist layer 51. In this case as well, the planar shape of the projection 40T is greater in diameter than the planar shape of part of the via 40 inside the through hole 1x, and the upper surface 40Ta of the projection 40T is depressed to be deeper in the center than in the periphery, the same as in the first embodiment. Therefore, it is possible to increase the surface area of the projection 40T, and accordingly, to increase the heat dissipation of the semiconductor device 100A.

Suitable materials for the solder resist layer 51 covering the upper surface 40Ta of the projection 40T include, for example, highly thermally conductive insulating materials. Suitable examples of highly thermally conductive insulating materials include an insulating material that includes an epoxy resin, a polyimide resin, or an acrylic resin as a base material and contains a highly thermally conductive filler. Suitable examples of fillers include inorganic fillers such as aluminum oxide (alumina), titanium oxide (titania), and magnesium oxide (magnesia).

In particular, the via 40 is directly joined to the wiring layer 32 (pad) connected to the electronic component 140. Therefore, when the electronic component 140 is a heat-generating component, heat generated by the electronic component 140 is efficiently transferred to the via 40 through the wiring layer 32 (pad) to be released from the upper surface 40Ta of the projection 40T through the via 40 serving as a heat transfer path. In this case as well, because the through hole 1x is a hole formed by piercing to have a relatively large diameter (approximately 150 μm), the thermal resistance of the via 40 serving as a heat transfer path can be reduced to create an advantage in heat dissipation.

Second Embodiment

A second embodiment illustrates a wiring substrate on which multiple electronic components are vertically and laterally mounted. In the following description, the same element or configuration as that of the above-described embodiment and variation is referred to using the same reference numeral, and a description thereof may be omitted.

Figure 6A:
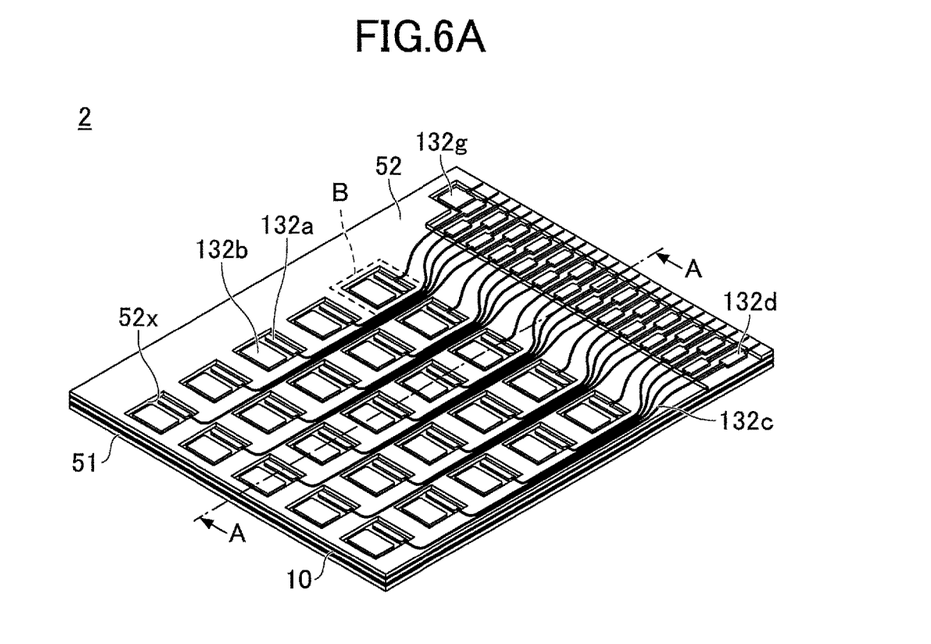
FIGS. 6A and 6B are perspective views of a wiring substrate according to a second embodiment.
Figure 6B:
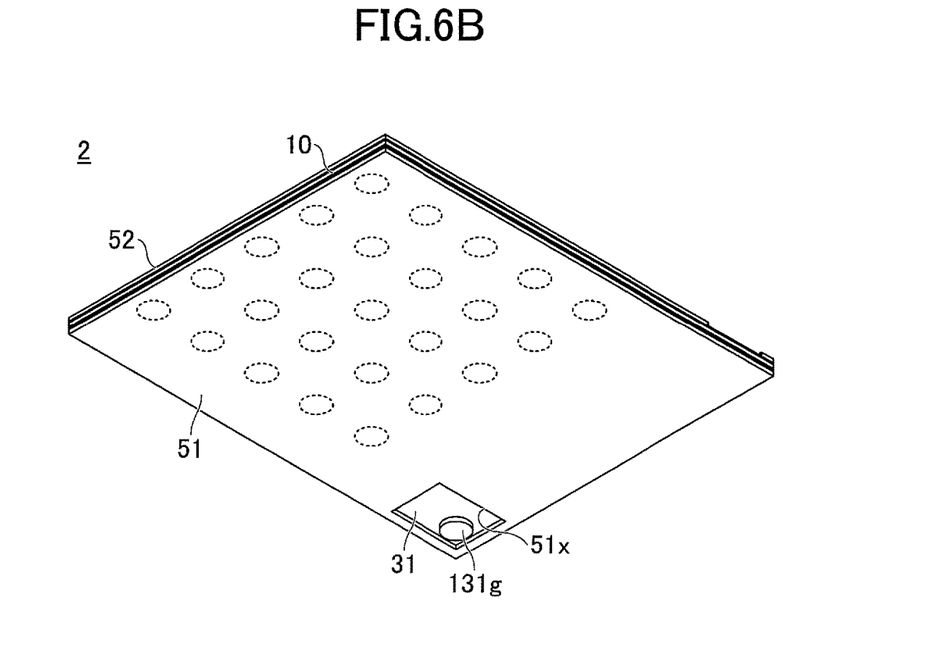
Figure 7A:
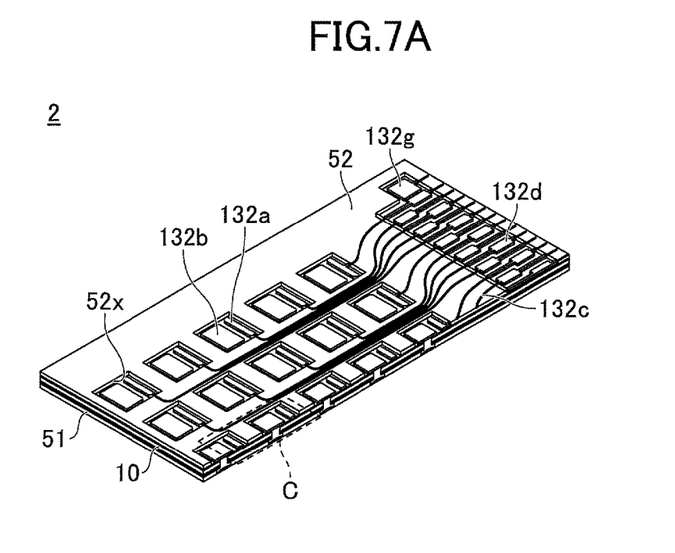
FIGS. 7A and 7B are perspective, cross-sectional views of the wiring substrate according to the second embodiment.
Figure 7B:
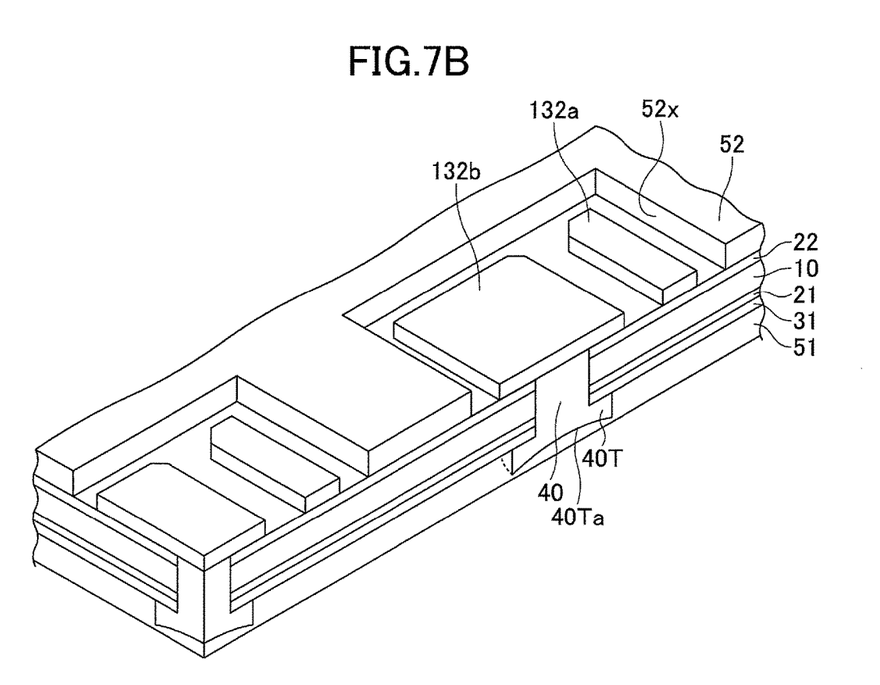

FIGS. 6A and 6B are a top perspective view and a bottom perspective view, respectively, of a wiring substrate according to the second embodiment. FIG. 7A is a perspective, cross-sectional view of the wiring substrate of FIG. 6A, taken along the line A-A. FIG. 7B is an enlarged perspective, cross-sectional view of part C of FIG. 7A.

Referring to FIGS. 6A through 7B, a wiring substrate 2 has the same laminated structure as the wiring substrate 1A depicted in FIG. 4. In FIGS. 6A through 7B, however, the wiring substrate 2 is depicted in an inverted position relative to the position of the wiring substrate 1A. Furthermore, in FIGS. 6A through 7B, wiring patterns 132c are depicted as visible through the solder resist layer 52.

The wiring substrate 2 includes multiple (twenty-five in the case depicted in FIGS. 6A and 6B) electronic component mounting regions B each for mounting a single electronic component. The electronic component mounting regions B may be arranged in a grid on the insulating layer 10, for example. Each electronic component mounting region B includes the wiring layer 31, the wiring layer 32, which includes electronic component mounting pads for mounting an electronic component, and the via 40.

To be more specific, the wiring layer 32 includes electronic component mounting pads 132a and 132b, the wiring patterns 132c, external terminals 132d, and an external terminal 132g. The electronic component mounting pads 132a and 132b are arranged to be exposed in the openings 52x of the solder resist layer 52 (NSMD).

Furthermore, the external terminals 132d and the single external terminal 132g are arranged on the surface of the wiring substrate 2 on the same side as the electronic component mounting regions B to be exposed inside the openings 52x of the solder resist layer 52 (NSMD). Each electronic component mounting pad 132a is electrically connected to a corresponding one of the external terminals 132*d* through a corresponding one of the wiring patterns 132*c*.

Each electronic component mounting pad 132*b* is electrically connected to the wiring layer 31 through the via 40. The wiring layer 31 is a planar ground (GND) pattern common to the electronic component mounting regions B. An external terminal 131*g* connected to the wiring layer 31 is disposed to be exposed inside the opening 51*x* of the solder resist layer 51 (NSMD). The external terminal 131*g* is electrically connected to the external terminal 132*g* through the via 40. The external terminals 131*g* and 132*g* are GND terminals.

By arranging the electronic component mounting pads 132*a* and 132*b* as depicted in FIGS. 6A through 7B, it is possible to mount a two-terminal electronic component (such as a light-emitting diode) on each electronic component mounting region B. In the case of mounting light-emitting diodes as electronic components, the positive lead and the negative lead of each light-emitting diode are connected to one of the electronic component mounting pads 132*a* and one of the electronic component mounting pads 132*b* (GND), respectively. As a result, by applying a predetermined voltage between the external terminal 131*g* or 132*g* (GND) and any selected one of the external terminals 132*d,* it is possible to cause a corresponding one of the light-emitting diodes to emit light. For example, by applying a predetermined voltage between the external terminal 131*g* or 132*g* (GND) and each external terminal 132*d,* it is possible to simultaneously cause all the mounted light-emitting diodes to emit light.

Thus, the wiring substrate 2 according to the second embodiment enables high-density mounting of multiple electronic components. Furthermore, the planar shape of the projection 40T is greater in diameter than the planar shape of part of the via 40 inside the through hole 1*x*, and the upper surface 40Ta of the projection 40T is depressed to be deeper in the center than in the periphery, the same as in the first embodiment. Therefore, it is possible to increase the surface area of the projection 40T, and accordingly, to increase the heat dissipation of mounted electronic components such as light-emitting diodes.

In particular, the via 40 is directly joined to the electronic component mounting pad 132*b* connected to the mounted light-emitting diode. Therefore, heat generated by the light-emitting diode is efficiently transferred to the via 40 through the electronic component mounting pad 132*b* to be released from the upper surface 40Ta of the projection 40T through the via 40 serving as a heat transfer path.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, electronic components to be mounted on the wiring substrates 1, 1A and 2 are not limited to light-emitting devices such as light-emitting diodes, and may be heat-generating electronic components that generate heat because of an electric current that flows through during operations. The wiring substrates 1, 1A and 2, which have good heat dissipation characteristics, can increase the heat dissipation of mounted electronic components to reduce problems caused by heat. Examples of heat-generating electronic components other than light-emitting devices include power semiconductor devices. Examples of power semiconductor devices include insulated-gate bipolar transistors (IGBTs) and metal-oxide-semiconductor field-effect transistors (MOSFETs).

Furthermore, electronic components to be mounted on the wiring substrates 1, 1A and 2 are not limited to heat-generating electronic components, and may be, for example, various types of sensors. Furthermore, the number of electronic components to be mounted on the wiring substrates 1, 1A and 2 may be determined as desired.

Various aspects of the subject-matter described herein may be set out non-exhaustively in the following numbered clauses:

1. A method of manufacturing a wiring substrate, the method including:

forming a through hole in a base that includes an insulating layer and a first wiring layer provided on a first side of the insulating layer by punching, so that the through hole pierces through the insulating layer and the first wiring layer;

providing a metal layer on a second side of the insulating layer opposite to the first side to cover the through hole with the metal layer;

forming a second wiring layer by patterning the metal layer;

forming a masking layer on a surface of the first wiring layer facing away from the insulating layer, the masking layer including an opening that exposes the through hole;

forming a via by electroplating using the second wiring layer as a power feed layer, so that the via fills in the through hole exposed in the opening to have an end portion projecting from the surface of the first wiring layer into the opening, and a surface of the end portion facing in a same direction as the surface of the first wiring layer is depressed to be deeper in a center than in a periphery thereof; and removing the masking layer.

2. The method of clause 1, wherein the via is formed to have the end portion extending onto the surface of the first wiring layer around the through hole.

3. The method of clause 1, wherein the through hole is formed by performing the punching from the surface of the first wiring layer, and a part of the first wiring layer that defines the through hole is caused to project toward the insulating layer by the punching.

What is claimed is:
1. A wiring substrate, comprising:
an insulating layer;
a first wiring layer and a second wiring layer on opposite sides of the insulating layer; and
a via piercing through the first wiring layer and the insulating layer to electrically connect to the second wiring layer, the via including an end portion projecting from a first surface of the first wiring layer facing away from the insulating layer,
wherein a surface of the end portion facing in a same direction as the first surface of the first wiring layer is depressed to be deeper in a center than in a periphery thereof.
2. The wiring substrate as claimed in claim 1, wherein the via fills in a through hole piercing through the first wiring layer and the insulating layer, and the end portion extends onto the first surface of the first wiring layer around the through hole.

3. The wiring substrate as claimed in claim 1, further comprising:
a solder resist layer provided on the first surface of the first wiring layer, and including a plurality of openings that expose the first wiring layer and the end portion,
wherein the first wiring layer and the end portion exposed in the plurality of openings define external connection pads.

4. The wiring substrate as claimed in claim 1, further comprising:
a solder resist layer provided on the first surface of the first wiring layer, and including an opening that exposes the first wiring layer, the solder resist layer covering the surface of the end portion,
wherein the first wiring layer exposed in the opening defines an external connection pad.

5. The wiring substrate as claimed in claim 1, wherein an edge of a part of the first wiring layer that contacts a sidewall of the via at a second surface of the first wiring layer opposite to the first surface projects toward the insulating layer relative to the second surface.

6. The wiring substrate as claimed in claim 1, wherein an edge of a part of the first wiring layer that contacts a sidewall of the via at the first surface of the first wiring layer is rounded.

7. The wiring substrate as claimed in claim 1, wherein
the second wiring layer includes an external connection pad, and
the via includes another end portion directly joined to the external connection pad.

8. The wiring substrate as claimed in claim 1, wherein
a plurality of mounting regions each for mounting an electronic component are arranged in a grid on the insulating layer, and
each of the plurality of mounting regions includes the first wiring layer, a plurality of pads for mounting the electronic component included in the second wiring layer, and the via.

* * * * *